(12) United States Patent
Pister et al.

(10) Patent No.: US 7,881,239 B2
(45) Date of Patent: Feb. 1, 2011

(54) LOW-POWERED AUTONOMOUS RADIO NODE WITH TEMPERATURE SENSOR AND CRYSTAL OSCILLATOR

(75) Inventors: Kristofer S. J. Pister, Orinda, CA (US); Yuri S. Zats, Menlo Park, CA (US); Robert Alan Contant, Oakland, CA (US); Noah Treuhaft, Berkeley, CA (US)

(73) Assignee: Dust Networks, Inc., Hayward, CA (US)

( * ) Notice: Subject to any disclaimer, the term of this patent is extended or adjusted under 35 U.S.C. 154(b) by 734 days.

(21) Appl. No.: 11/125,529

(22) Filed: May 10, 2005

(65) Prior Publication Data

US 2005/0213612 A1  Sep. 29, 2005

Related U.S. Application Data

(63) Continuation of application No. 10/960,709, filed on Oct. 6, 2004, now Pat. No. 7,529,217.

(60) Provisional application No. 60/557,148, filed on Mar. 27, 2004.

(51) Int. Cl.
*G08C 17/00* (2006.01)
*H04W 4/00* (2009.01)
*H04J 3/06* (2006.01)

(52) U.S. Cl. ................. 370/311; 370/338; 370/503

(58) Field of Classification Search ............... None
See application file for complete search history.

(56) References Cited

U.S. PATENT DOCUMENTS

| | | | |
|---|---|---|---|
| 3,737,746 A * | 6/1973 | Cielaszyk et al. | ........... 318/130 |
| 4,550,397 A | 10/1985 | Turner et al. | |
| 4,939,726 A | 7/1990 | Flammer et al. | |
| 4,947,388 A | 8/1990 | Kuwahara et al. | |
| 5,007,052 A | 4/1991 | Flammer | |
| 5,007,752 A | 4/1991 | Yasumi et al. | |

(Continued)

FOREIGN PATENT DOCUMENTS

GB   2271691 A   9/1992

OTHER PUBLICATIONS

IEEE 802.15.4-2003 IEEE Standard for Information Technology-Telecommunications and information exchange between systems—Local and metropolitan area networks—Specific requirements Part 15.4: Wireless Medium Access Control (MAC) and Physical Layer (PHY) Specifications for Low Rate Wireless Personal Area Networks (LR-WPANs) (Also available as online subscription at http://standards.ieee.org/catalog/oils/lanman.html).

(Continued)

*Primary Examiner*—Pankaj Kumar
*Assistant Examiner*—Marcus R Smith
(74) *Attorney, Agent, or Firm*—Van Pelt, Yi & James LLP

(57) ABSTRACT

A device for a node in a digraph network comprising is disclosed. The device comprises an internal time reference, a radio receiver, a radio transmitter. The device further comprises a temperature sensor for stabilizing the internal time reference against drifting with respect to an internal time reference of another node in the network and a microprocessor for managing the reception and transmission of information.

24 Claims, 8 Drawing Sheets

U.S. PATENT DOCUMENTS

| | | | |
|---|---|---|---|
| 5,079,768 A | 1/1992 | Flammer | |
| 5,115,433 A | 5/1992 | Baran et al. | |
| 5,128,932 A | 7/1992 | Li | |
| 5,128,938 A | 7/1992 | Borras | |
| 5,130,987 A | 7/1992 | Flammer | |
| 5,471,469 A | 11/1995 | Flammer, III et al. | |
| 5,488,608 A | 1/1996 | Flammer, III | |
| 5,515,369 A | 5/1996 | Flammer, III et al. | |
| 5,570,084 A | 10/1996 | Ritter | |
| 5,748,103 A | 5/1998 | Flach et al. | |
| 5,903,566 A | 5/1999 | Flammer, III | |
| 6,049,708 A | 4/2000 | Tsujita | |
| 6,081,511 A | 6/2000 | Carr et al. | |
| 6,208,668 B1 * | 3/2001 | Dorenbosch | 370/509 |
| 6,347,340 B1 | 2/2002 | Coelho et al. | |
| 6,621,805 B1 | 9/2003 | Kondylis et al. | |
| 6,639,957 B2 | 10/2003 | Cahill-O'Brien et al. | |
| 6,667,957 B1 | 12/2003 | Corson et al. | |
| 6,671,525 B2 | 12/2003 | Allen et al. | |
| 6,678,252 B1 | 1/2004 | Cansever | |
| 6,690,655 B1 * | 2/2004 | Miner et al. | 370/278 |
| 6,714,552 B1 | 3/2004 | Cotter | |
| 6,735,178 B1 | 5/2004 | Srivastava et al. | |
| 6,788,702 B1 | 9/2004 | Garcia-Luna-Aceves et al. | |
| 6,804,503 B2 * | 10/2004 | Shohara et al. | 455/343.4 |
| 6,826,607 B1 | 11/2004 | Gelvin et al. | |
| 7,002,910 B2 | 2/2006 | Garcia-Luna-Aceves et al. | |
| 7,035,240 B1 | 4/2006 | Balakrishnan et al. | |
| 7,046,166 B2 * | 5/2006 | Pedyash et al. | 340/870.07 |
| 7,119,676 B1 | 10/2006 | Silverstrim et al. | |
| 7,127,254 B2 | 10/2006 | Shvodian et al. | |
| 7,133,373 B2 | 11/2006 | Hester et al. | |
| 7,142,524 B2 | 11/2006 | Stansforth et al. | |
| 7,221,686 B1 | 5/2007 | Belcea | |
| 7,245,405 B2 | 7/2007 | Friedman et al. | |
| 7,280,518 B2 | 10/2007 | Montano et al. | |
| 7,305,240 B2 | 12/2007 | Chou et al. | |
| 7,324,559 B2 | 1/2008 | McGibney | |
| 7,385,943 B2 | 6/2008 | Niddam | |
| 2001/0053176 A1 * | 12/2001 | Fry et al. | 375/133 |
| 2002/0126627 A1 | 9/2002 | Shi et al. | |
| 2003/0087617 A1 | 5/2003 | Shohara | |
| 2003/0134644 A1 | 7/2003 | Reed et al. | |
| 2004/0042405 A1 | 3/2004 | Nesbitt | |
| 2004/0266481 A1 | 12/2004 | Patel et al. | |
| 2005/0041627 A1 | 2/2005 | Duggi | |
| 2005/0124346 A1 | 6/2005 | Corbett et al. | |
| 2005/0155839 A1 * | 7/2005 | Banks et al. | 194/302 |
| 2005/0159106 A1 | 7/2005 | Palin et al. | |
| 2005/0195105 A1 | 9/2005 | McBurney et al. | |
| 2005/0249170 A1 | 11/2005 | Salokannel et al. | |
| 2006/0062188 A1 | 3/2006 | Nyberg et al. | |
| 2006/0187866 A1 * | 8/2006 | Werb et al. | 370/311 |
| 2006/0239333 A1 * | 10/2006 | Albert et al. | 375/130 |
| 2007/0258508 A1 * | 11/2007 | Werb et al. | 375/140 |
| 2008/0031213 A1 | 2/2008 | Kaiser et al. | |

OTHER PUBLICATIONS

Hohlt, Doherty, Brewer, "Flexible Power Scheduling for Sensor Networks", *IPSN 2004*, Berkeley, CA, Apr. 2004.

Polastre, Hill and Culler, "Versatile Low Power Media Access for Wireless Sensor Networks", *Pedamacs* (Coleri, UCB) SMAC (UCLA).

* cited by examiner

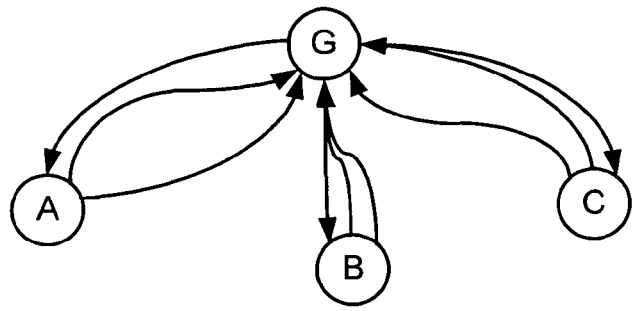
FIG. 9A
| A→G | A→G | G→A | B→G | B→G | G→B | C→G | C→G | G→C | ch0 |
|---|---|---|---|---|---|---|---|---|---|
| s0 | s1 | s2 | | | | | | s8 | |
FIG. 9B
| A→G | | | | | A→G | | | G→A | | | ch0 |
|---|---|---|---|---|---|---|---|---|---|---|---|
| | B→G | | | | | B→G | | | G→B | | ch1 |
| | | C→G | | | | | C→G | | | G→C | ch2 |
FIG. 9C
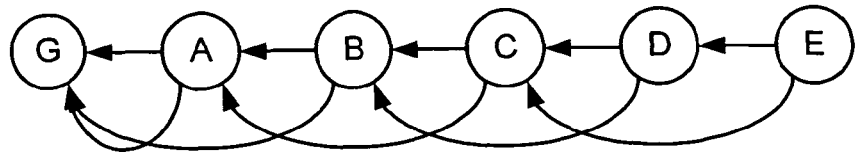
FIG. 10A
| s0 | s1 | s2 | | s4 | s5 | | | s8 | | | s11 | |
|---|---|---|---|---|---|---|---|---|---|---|---|---|
| E→C | C→A | A→G | | E→D | D→C | C→B | B→A | A→G | | | | ch0 |
| D→B | B→G | | | C→B | B→A | A→G | | | | | | ch1 |
| A→G | | | | A→G | | | | | | | | ch2 |
FIG. 10B

LOW-POWERED AUTONOMOUS RADIO NODE WITH TEMPERATURE SENSOR AND CRYSTAL OSCILLATOR

CROSS REFERENCE TO OTHER APPLICATIONS

This application claims priority to U.S. Provisional Patent Application No. 60/557,148 entitled COMMUNICATIONS PROTOCOL FOR REMOTE SENSOR NETWORKS filed Mar. 27, 2004 which is incorporated herein by reference for all purposes.

This application is a continuation of co-pending U.S. patent application Ser. No. 10/960,709 entitled LOW-POWERED AUTONOMOUS NODE FOR MESH COMMUNICATION NETWORK filed Oct. 6, 2004 which is incorporated herein by reference for all purposes.

Co-pending U.S. patent application Ser. No. 10/914,056 entitled DIGRAPH BASED MESH COMMUNICATION NETWORK filed Aug. 5, 2004 is incorporated herein by reference for all purposes.

BACKGROUND OF THE INVENTION

This invention relates to wireless data networks and more particularly to a multiple-hop wireless radio frequency mesh network routing scheme employing a packet switched frequency-hopping spread spectrum time-sharing communications protocol. This invention has particular application to data collection from an array of sensors disposed in a topology wherein at least two intelligent communication nodes are within reliable radio communication range within a matrix of peer communication nodes.

Wireless mesh networks employ intelligent nodes comprising a transmitter and receiver, a power source, input devices, sometimes output devices, and an intelligent controller, such as a programmable microprocessor controller with memory. In the past, wireless mesh networks, such as the internet, have been developed having configurations or networks for communication that are static, dynamic or a hybrid of static and dynamic. Power for these networks has been most often supplied via wires (the nodes are "plugged in") or occasionally from batteries. As the size, power, and cost of the computation and communication requirements of these devices has decreased over time, battery powered wireless systems have become smaller and smaller. The limit to size scaling resulting from this trend to smaller and lower power wireless devices is in the millimeter size range, leading to predictions of "smart dust". For this reason, the research community has adopted the name mote to refer to a small wireless sensor device. Mote is an old English word meaning a speck of dust.

A self-contained unit of communication information is called a packet. A packet has a header, a payload and an optional trailer (FIG. 2). A link is a path which originates at exactly one node and terminates at exactly one other node. A node is thus any vertex or intersection in a communication network. A node may be passive or intelligent. In the present invention, a mote is assumed to be an intelligent node in that it is capable of receiving and analyzing information, taking certain actions as a result of received information, including the storing of received or processed information, modifying at least part of received information, and in some instances originating and retransmitting information.

In ATM systems, a cell is a channel-specific time period of fixed duration during which a unit of communication occurs between two fixed terminals without conflict. By comparison, as used herein, a slot refers to a time period during which a packet can be sent as well as acknowledged, and a cell refers to a particular slot and radio channel offset in a superframe (defined below). In conventional TDMA systems, such as defined by the DS-1 (T-1) standard, a frame is a period of time of defined and fixed duration. By contrast, as used in connection with the present invention, a superframe is an arbitrary number of slots and thus can be of variable duration. A superframe is iterated each cycle, as hereinafter explained.

According to the invention, communication between intelligent nodes occurs only at specific times and on specific channels. Each intelligent node in a network represents its connectivity to other intelligent nodes in the network as a collection of directed links on one or more digraphs. Each superframe repeats in a continuous sequence of cycles. Each link can be used for the transmission and optional acknowledgement of a single packet. Thus, in a given superframe, the available bandwidth from intelligent node A to intelligent node B (in packets per second) is the product of the number of links from A to B in the superframe (links per cycle) and the superframe rate (cycles per second). For example, if there were 1 link from intelligent node A to intelligent node B in superframe S, and superframe S consisted of 100 slots of duration 50 ms per slot, then the length of a single cycle of superframe S would be five seconds (100×0.05=5), and the superframe rate would be 0.2 cycles/second. With one available link per frame, intelligent node A would be able to send at most one packet to intelligent node B every five seconds. In the same superframe, intelligent node B might have ten links to intelligent node A, giving B ten times the bandwidth to A as A has to B. In a separate superframe F with 10 slots of length 50 ms, intelligent node A might have five links to intelligent node C, giving an available bandwidth of 10 packets per second (1 packet/link*5 links/cycle*2 cycles/second).

The ability to create multiple superframes of different lengths, and assign different numbers of links between intelligent nodes in each superframe provides flexibility to the network designer. This flexibility allows bandwidth, redundancy, latency, and many other network performance parameters to be traded off against power consumption.

There is a one to one correspondence between digraphs or networks and superframes. Digraphs are the abstract representation of a superframe, and they allow designers to look at and design collections of links and understand their function. Each link in a digraph is assigned a cell, that is, a particular time slot offset and channel offset, in the corresponding superframe. In each cycle of the superframe, these two offsets are used together with the cycle number to calculate the exact time and frequency on which the intelligent node is to turn on its radio.

A circuit switched network is a communication network in which a fixed route is established and reserved for communication traffic between an origin and an ultimate destination. A packet-switched network is a communication network in which there is no reserved path between an origin and a destination such that self-contained units of communication traffic called packets may traverse a variety of different sets of links between the origin and the destination during the course of a message.

Packet switched networks, as opposed to circuit switched networks, are susceptible to multiple simultaneous communication and connectivity with competing data sources, so that packet collisions can result. Absent control over access, such networks suffer from inefficiency of bandwidth utilization and capacity limitations due to collisions among packets transmitted at the same time and sharing the same spectrum.

Consequently, packets may be lost and thus must be retransmitted to complete message, resulting in substantial loss of efficiency.

The efficiency of communication is particularly critical in applications calling for extremely small size and low power consumption, where intelligent nodes are spaced relatively close to one another with the potential for substantial interference.

Frequency hopping spread spectrum systems are known, such as the systems derived from the technology of Metricom, Inc., now out of business, which developed and deployed the UtiliNet and Ricochet networks still in use. In such a system, nodes in communication with one another track a pre-agreed-upon pseudo-random frequency hopping pattern in order to maintain a communication link. Several systems could co-exist in a topology without undue interference.

By contrast, ATM adapts circuit switched systems to support packet communications. ATM stands for Asynchronous Transfer Mode and refers to a specific standard for a cell switching network with a bandwidth from 25 Mbps to 622 Mbps. In ATM systems, channel-specific time periods called cells are assigned to carry packets and route packets via these cells from an explicit source to an explicit destination in accordance with a circuit switched model. The speed of switching is enhanced by rapid examination of routing information in packet headers.

The virtual circuit in an ATM system is like a fluid pipeline: it starts in one place and ends in another and may zigzag as it goes through various pumping stations, but topologically it is a continuous straight line. The paradigm of the Internet is packet switched network. A packet switched network is analogous to an airline: in principle one could fly from coast to coast via various routes through any number of different cities, but booking with a particular airline results in a flight route through a particular node or hub city, such as Chicago. If you get to Chicago and the plane originally scheduled to fly to the ultimate destination, such as New York is out of service, it is normally necessary to re-book the remainder of the flight route via a different plane or intersecting airline service.

Also well known in the art are various packet based protocols, such as X.25 and TCP/IP, both of which typical employ in part source routing, namely explicit routing between source and destination in a packet switched model. These have been described in various readily available standards.

In order to further understand the background of the invention, it is helpful to understand a number of related concepts. Referring to FIG. 1A, a graph is defined a collection of vertices or intelligent nodes with connections, or links, between the intelligent nodes. Referring to FIG. 1B, a digraph is defined as a graph where all of the links have an associated direction, so that a digraph connects a plurality of intelligent nodes in a network with links defining direction of flow. Referring to FIG. 1C, a multi-digraph is defined as a digraph in which there exists at least one pair of links which both originate at the same originating intelligent node and terminate on the same terminating intelligent node. It is possible to have multiple multi-digraphs, if there is a first multi-digraph in which each link is labeled "1", and a second multi-digraph in which each link is labeled "2", and one or more of the intelligent nodes in the first graph is also in the second graph, then this is an example of multiple multi-digraphs.

Herein the concept of digraph-based packet transport is introduced. Digraph based packet transport is analogous to water flowing in a river delta with its meandering branches. If a number of intelligent entities each in an independent unpropelled watercraft were dropped all over the delta with no means of guidance except to choose a path at each fork, they would take a wide variety of paths, depending on flow and congestion. Eventually, all would arrive at the basin. Two that started far apart might end up close together, and two that started near each other might take completely different paths and arrive at different times.

A number of patents and publications provide background on other approaches to packet communication. Examples of instructive patents include: U.S. Pat. Nos. 4,550,397; 4,947,388; 4,939,726; 5,007,052; 5,079,768; 5,115,433; 5,130,987; 5,471,469; 5,488,608; 5,515,369; 5,570,084; 5,903,566; 6,735,178.

Instructive Publications:

IEEE 802.15.4-2003 IEEE Standard for Information Technology-Telecommunications and information exchange between systems—Local and metropolitan area networks—Specific requirements Part 15.4: Wireless Medium Access Control (MAC) and Physical Layer (PHY) Specifications for Low Rate Wireless Personal Area Networks (LR-WPANs) (Also available as online subscription at http://standards.ieee-.org/catalog/oils/lanman.html).

Hohlt, Doherty, Brewer, "Flexible Power Scheduling for Sensor Networks", *IPSN* 2004, Berkeley, Calif., April 2004.

Polastre, Hill and Culler, "Versatile Low Power Media Access for Wireless Sensor Networks", *Pedamacs* (Coleri, UCB) SMAC (UCLA).

What is needed is a communication system that is especially adapted to communication environments with a variety of random origins and random receivers, which is efficient, secure, reliable, scalable, and low power.

SUMMARY OF THE INVENTION

According to the invention, in a packet communication network, a method and apparatus for packet switched transport is provided among intelligent nodes wherein the duty cycling of the intelligent nodes is minimized in order to maximize power life using a synchronization algorithm that assures all nodes are able to propagate information through the network without undue use of transmission and reception power. Frequency hopping time-division multiple access supports packet communication between intelligent nodes via assigned directed links, each link being assigned to a time-channel offset (cell) in a superframe, so that a link carrying a packet string between any two intelligent nodes is active only during its assigned time slot. The result is efficient use of spectrum and minimal expenditure of power. If multiple superframes are employed and all frequency slots are simultaneously operating in synchronicity, the spectrum has the potential for 100% data utilization, less guard band spectrum.

The invention will be better understood by reference to the following detailed description in connection with the accompanying drawings.

BRIEF DESCRIPTION OF THE DRAWINGS

FIGS. 9A, 9B, and 9C are respectively a diagram of a digraph of a simple star-connected network that shows two different implementations of that digraph, one in a superframe with nine slots on a single channel (FIG. 9B) and one with twelve slots on three channels (FIG. 9C).

FIGS. 10A and 10B are respectively a diagram of an example digraph associated with a linear network and an example implementation of that digraph in a superframe with 12 slots in three channels.

DESCRIPTION OF SPECIFIC EMBODIMENTS OF THE INVENTION

Figures 1A, 1B, 1C:
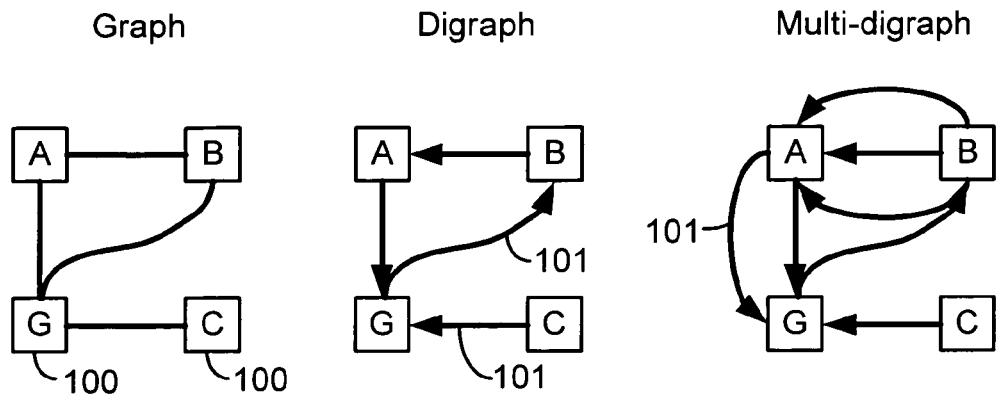
FIGS. 1A, 1B and 1C are diagrams illustrating different kinds of graphs.
Figure 2:
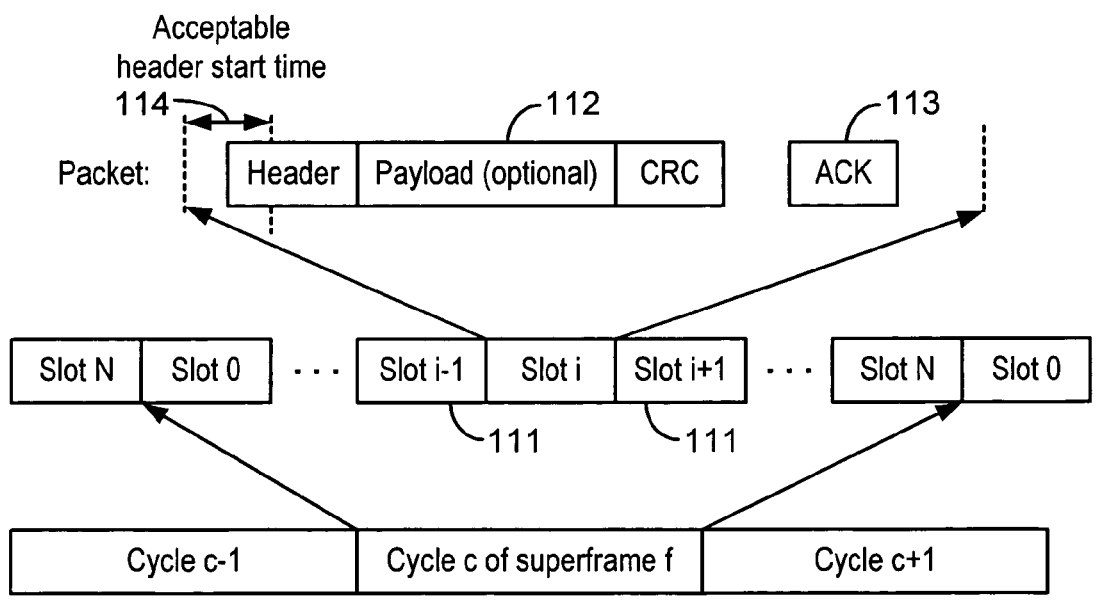
FIG. 2 is a diagram illustrating the relationship of communication packets, time slots, and superframe cycles.

In a sensor network, which is one application of the invention, the vertices of a graph, representing the topology of the network, are the sites of intelligent nodes, also designated "motes," either physical or symbolic, which are capable of analyzing incoming traffic and sensory data and which can act upon the traffic, reroute traffic and originate information from the site. Directed links (101 FIG. 1B) between intelligent nodes A, B, C, G represent communication slots, and multiple links or slots (FIG. 1C) provide a mechanism for exhibiting relative available bandwidth between intelligent nodes. Every directed link in a digraph has the capability of transporting one packet in a given communication slot (FIG. 2). Each of these slots has a fixed length and admits the construction of a superframe (FIG. 2) which defines how the links in a given digraph will be distributed in time and frequency.

Referring to FIG. 2, in accordance with the invention, a slot is a period of time in a superframe (which consists of N slots) during which a packet may be sent and (optionally) acknowledged. Slots herein have a uniform, fixed duration, and therefore packets carried in any slot have a corresponding maximum data payload size within the constraints of the standard slot.

Superframes repeat, and each repetition is called a communication cycle, or simply a cycle. All intelligent nodes in a defined network share the same synchronized view of the occurrences of the edges of slots. Intelligent nodes may participate in multiple graphs/superframes and therefore communicate with other intelligent nodes at very different rates and with different latencies. There may be no single superframe which has slots that contains the traffic of all intelligent nodes in the network.

According to the invention, all intelligent nodes within a network, whether digraph-based or tree or conventional mesh, have a shared sense of time, synchronized to within about one millisecond (see below). In operation (FIG. 3A), if intelligent node B is transmitting to intelligent node A in time slot I (111, FIG. 3B), intelligent node A can therefore expect the transmission to occur within a few milliseconds of the beginning of slot I 111 during each cycle. If the header of the message has not been received within a few milliseconds of the beginning of slot I, (114, FIG. 2), intelligent node A will turn off its receiver (go to sleep) assuming that intelligent node B had nothing to send at that particular time. The result is that redundant receive links can be used in a network with a power penalty of roughly one tenth of the cost of a link that is used. Thus, if intelligent node B in general needs to send p number of packets per cycle to intelligent node A, there can be for example 3*p links dedicated to this task, of which only one third will typically be used. The unused links cost the transmitter no power at all (if the transmitter has no packets to send, as it will not turn on its output stage). The unused links cost the potential receiver much less than an active link, since the receiver need only be on for a fraction of the slot length as needed to detect whether a message is incoming. This 200% redundancy in links costs approximately 20% in additional power consumption, but it provides for a dramatic increase in the reliability of a network.

The duration of the "acceptable header start time" depends on the accuracy of clock synchronization (in parts per million) among intelligent nodes, as well as the length of delays between exchanges of packets and acknowledgment packets. Taken together, these parameters relate network latency, battery life and the superframe rate, or "chattyness" of the network.

Time clocks drift with temperature. For a reasonably simple temperature compensation scheme, the intelligent nodes are expected to a shared time base that is off by no more than a few tens of PPM. For a 100 second long superframe, that corresponds to a few milliseconds of error after one cycle of a superframe. If longer time periods for superframe length are desired (i.e. less communication chatter) then either the listening time must be increased, with corresponding power increase, or the clock drift must be reduced.

Figure 3A:
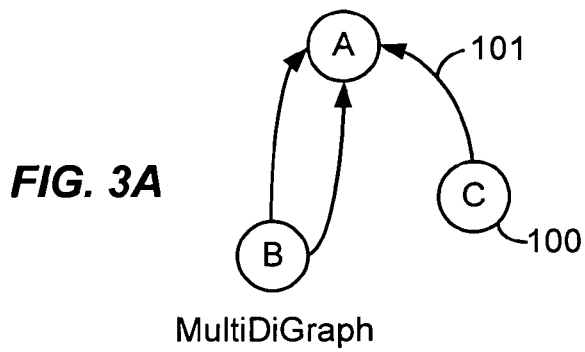
FIGS. 3A and 3B are diagrams illustrating the interrelationship of a digraph and a superframe.
Figure 3B:
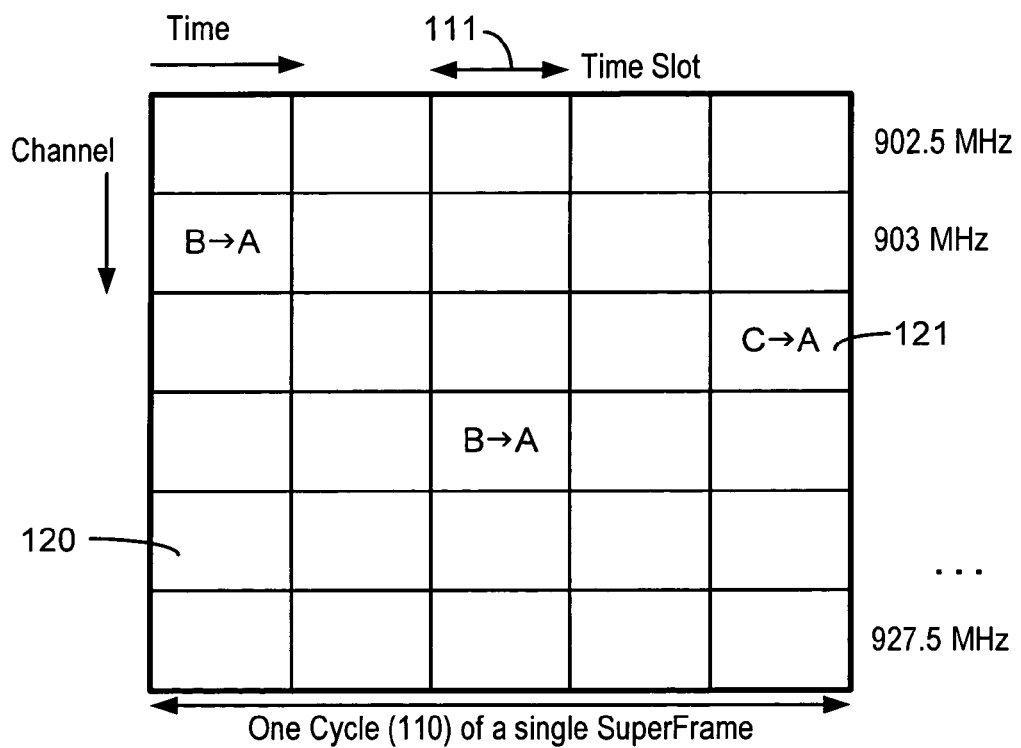

FIG. 3A illustrates the implementation a digraph through selection of slots in a time/frequency (slot/channel) plane of a superframe (FIG. 3B). Time (x-axis) is divided into slots, and frequency (y-axis) is divided into channels, for example in the ISM band from 902.5 MHz to 927.5 MHz in 500 kHz increments. Thus, each link in the graph has a corresponding time/frequency bucket, or slot, in time/frequency space.

An example of channel (frequency) assignment of three links in the multi-digraph is shown in FIG. 3B. Typical implementations would use pseudo-random and potentially time-varying channel/frequency mapping. In time order, the slot assignments are {1, 2} for B->A #1; {3,4} for B->A #2, and {5,3} for C->A, which slots are then repeated each cycle.

Figure 4:
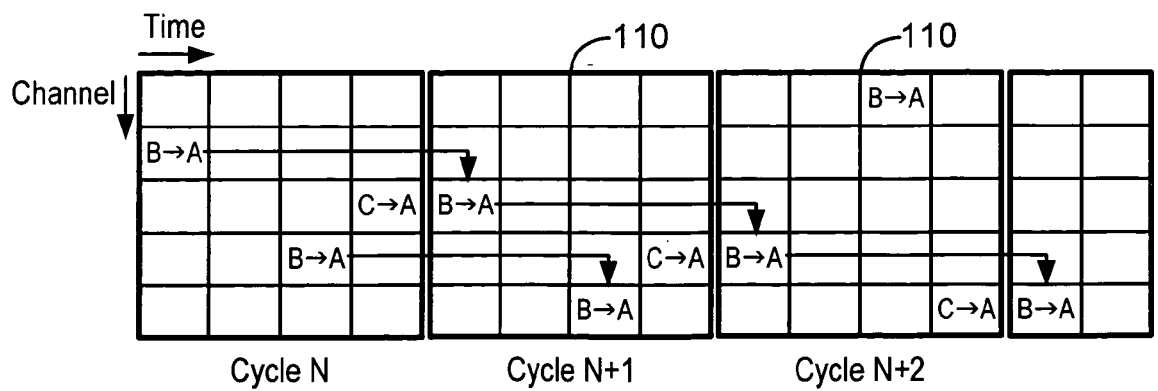
FIG. 4 is a diagram illustrating one way in which links between intelligent nodes hop across channels in different cycles.

Multiple cycles of a sample superframe, as shown in FIG. 4, illustrate how the communication channel changes each cycle. To maximize immunity to narrowband interference, the communication channel of the slot to which a link is assigned is offset by one channel each superframe. As shown in FIG. 4, each cycle the actual communication channel is incremented by one (modulo of the number of channels). In this way, every link in a network is effectively implemented over a pseudo-random sequence of frequencies. For some networks, this pseudo-random variation in frequency can also be applied to the time slot for the communication. In a variation, both ends of a digraph link can be informed as to the future slot usage of a superframe through appropriate identification and authentication, such as ID, password, etc., so that the communication can be effected without reliance on a predetermined slot pattern. As a further extension, the ends can identify to each other a selected one of a choice of slot usage patterns over future superframes.

Figure 5A:
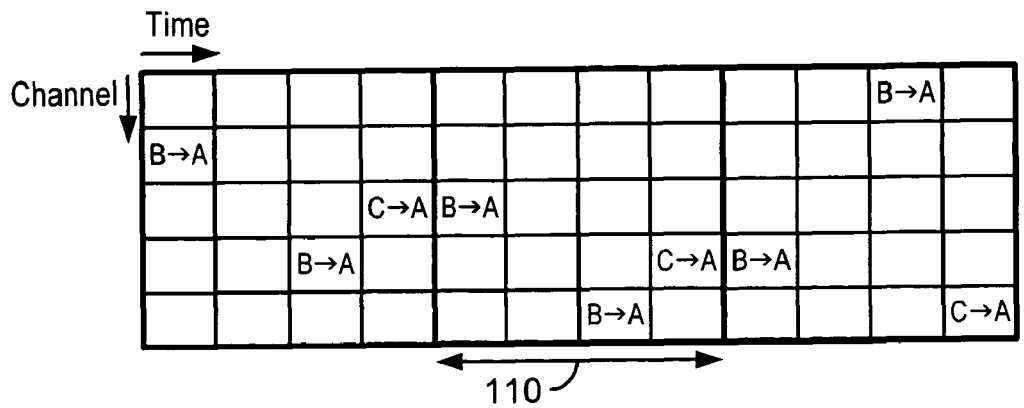
FIGS. 5A, 5B and 5C are diagrams illustrating two digraphs running on the same network of intelligent nodes with examples of what the superframe associated with each digraph might be.
Figure 5B:
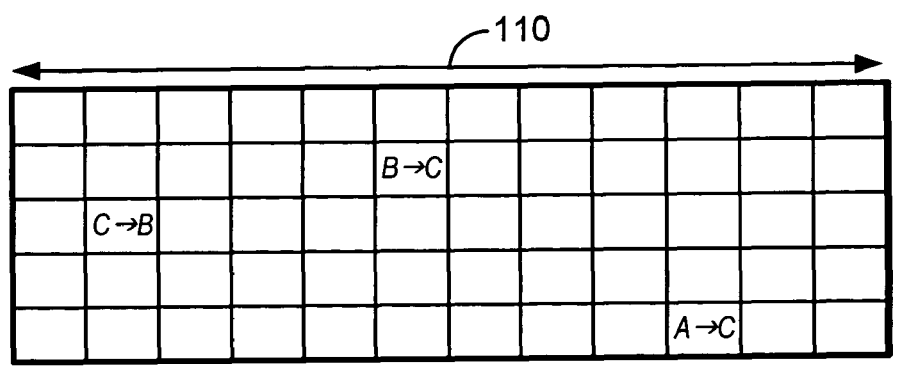
Figure 5C:
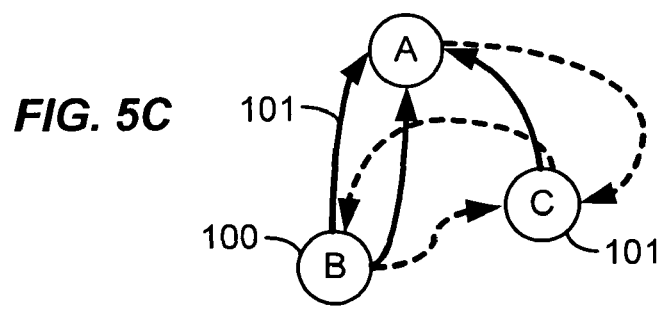

FIGS. 5A and 5B are diagrams illustrating two digraphs (FIG. 5C) running on the same network of intelligent nodes, with examples of what the superframe associated with each digraph might be. Herein the respective digraphs, herein labeled solid line and dashed line, corresponding to plain font and dashed line corresponding to bold italicized font, may be implemented on either identical or of independent sets of channels without causing interference with each other.

Figure 6:
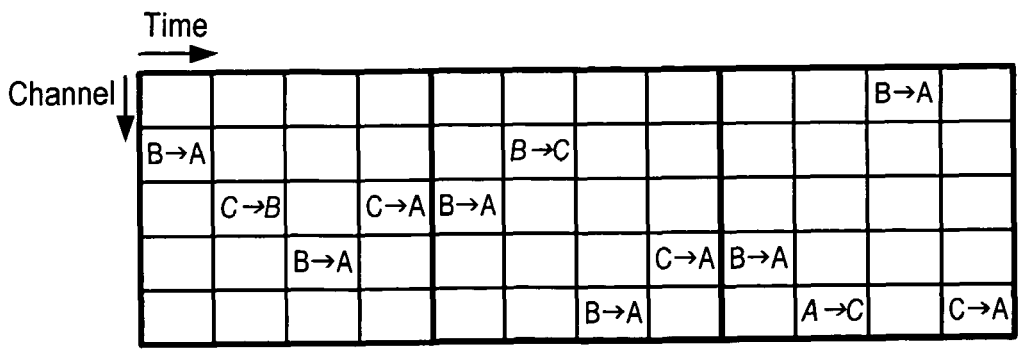
FIG. 6 is a diagram that shows the resulting combined link activity for the intelligent nodes in FIG. 5.

FIG. 6 illustrates how these two superframes share spectrum. By careful choice of superframe length and time slots, there is never a time-slot collision between the two superframes. The timeslots used by one superframe are blocked with respect to the other superframe. The two different digraphs in a network need not be implemented with the same transmission rate. As illustrated in FIG. 5B, by using a different length frame for the second digraph, in this case a subharmonic of the first digraph, links in the first digraph appear with three times the frequency of the links in the second digraph. Superframes are inherently composed of an integral number of slots, but they need not be integer multiples of each other in length. However, as in FIG. 6, by choosing the second superframe length to be an integer multiple of the first superframe length, it is possible to guarantee that there will be no collisions between the two superframes. Alternatively, using superframe lengths that are prime numbers will ensure that time-slot collisions, when they do occur, are evenly distributed among links.

A relatively a large number of links may be implemented in the typical embodiment according to the invention. For an embodiment with 50 channels and a 30 ms slot length, there are over 1500 slot/channel pairs available per second, with room for guard band and guard times.

In any network type according to the invention, each intelligent node must store its own collection of links. The information that an intelligent node must store to completely characterize a link is about 20 bytes long (superframe ID, slot, channel, partner, link type, etc.). This allows an intelligent node to store roughly 50 links/KB of RAM.

The representation and synchronization of time in a sensor network is essential if the network is synchronous and if energy is to be conserved. In a specific embodiment, all intelligent nodes are assumed to have a 32 kHz crystal oscillator, as typically found in a watch, as a time reference. Low-cost watch crystals are advantageous because of their low power consumption (sub-microwatt), but they are known to have substantial variation in frequency in both their manufacturing tolerance, as well as their temperature dependence. One simple representation of the actual oscillation frequency of a crystal oscillator is given by:

$$F_{osc}=F_{nom} \cdot (1+\mathrm{alpha}(T-T_{nom}+T_{off})^2+PPM_{off}+PPM_{drift})$$

where $F_{nom}$ is 32,768 Hz, $T_{nom}$ is 25 degrees C., and alpha is typically $0.0035+/-0.0005$ ppm/K$^2$, $T_{off}$ is +/-5K, $PPM_{off}$ is +/-20 ppm, and $PPM_{drift}$ is +/-3 ppm in the first year.

Taken together, these offsets and temperature dependencies generate a worst case of up to 200 ppm difference in crystal oscillation rate between two intelligent nodes under industrial temperature conditions. Even at room temperature, the difference can be almost 50 ppm. This implies that, without compensation, two intelligent nodes which synchronize their clocks at time $t_0$ could be off by as much as 12 ms one minute later, or 17 seconds after a day.

The majority of the error in clock rate is due to the quadratic dependence of frequency on temperature. The room-temperature frequency offset, $PPM_{off}$, as well as the quadratic coefficient, alpha, and the temperature peak offset, $T_{off}$, can all be measured at the time of manufacture, and a calibration table can be created which represents the difference between the actual frequency of the oscillator and the desired frequency of the oscillator. It is difficult to directly adjust the frequency of the crystal based on this knowledge, but it is relatively straightforward to adjust the digital counter which is incremented each cycle of the crystal.

Figure 7A:
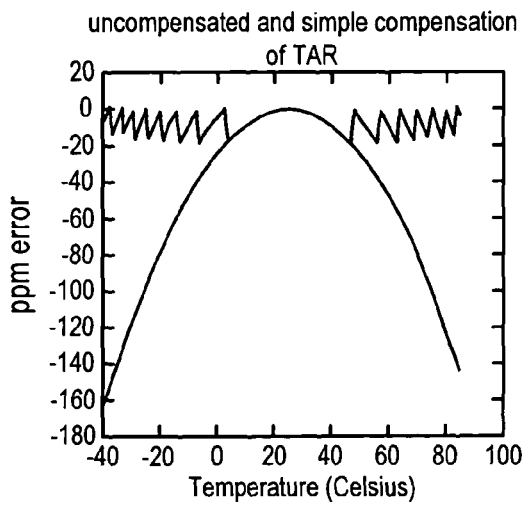
FIG. 7A is a graph that shows the theoretical relationship between crystal frequency error and temperature, before and after temperature compensation.

FIG. 7A is a graph of the simulated preliminary results of temperature compensation of the 32 kHz clock. The uncompensated crystal (smooth parabolic curve) has over 160 ppm error at low temperature. Compensating for the slow crystal error by adding additional ticks with a frequency dependent on the measured temperature yields the jagged line.

Figure 7B:
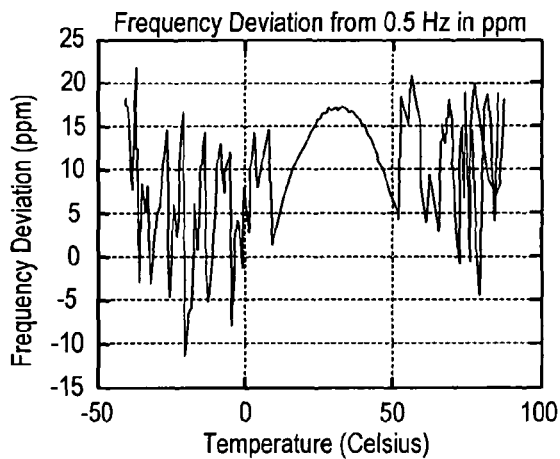
FIG. 7B is a graph that shows the actual measured frequency deviation versus temperature for crystal compensated according to the invention.

FIG. 7B is the actual preliminary results of temperature compensation of the 32 kHz clock. Measured data remains within roughly 20 ppm of zero error over the range −40 deg. C. to +85 deg. C. Because all crystals have slightly different parameters, it is likely that each intelligent node will need to be calibrated at the time of manufacture. This can be done either via a physical connection or an RF communication link. Intelligent nodes are placed in a temperature-controlled environment, informed of the ambient temperature, and given a time reference of some kind, such as a series of synchronizing packets via the RF link from a master controller. Based on this time and temperature reference, the intelligent nodes are expected to determine various calibration compensation parameters and to perform the corresponding compensations.

The calibration can be performed as follows: A simple method is to use table-lookup mapping technique to relate temperature to the appropriate delay for an extra "tick" of the 32 kHz clock. For example, if calibration determines that, at 0 deg. C., the clock is slow by 50 ppm, then every 20,000 ticks (the reciprocal of 50 ppm) a one tick adjustment is added.

Figure 8:
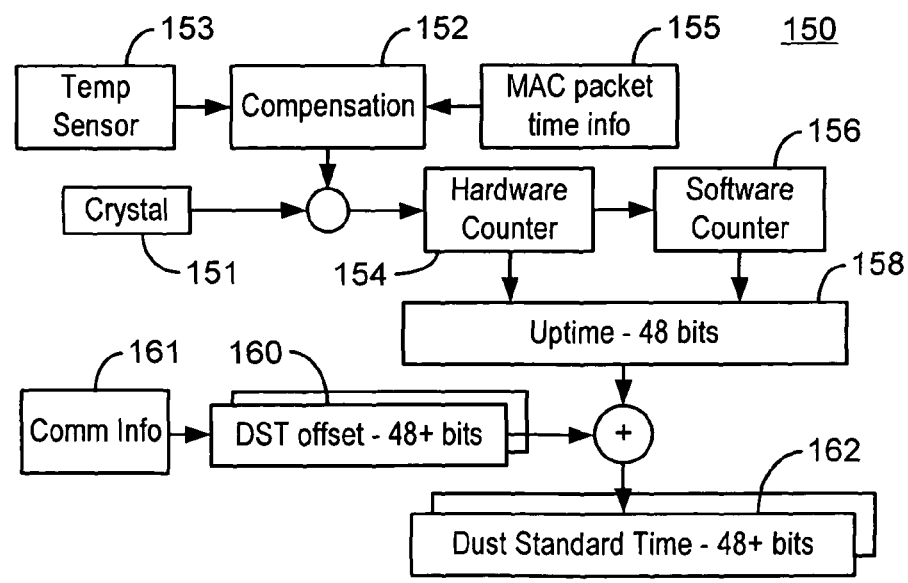
FIG. 8 is a block diagram that shows an on-board clock of the intelligent nodes.

A block diagram of a circuit 150 that illustrate this approach to calibration is shown in FIG. 8. A 32 kHz oscillator (crystal 151) provides the reference, which is corrected for temperature by a temperature sensor 153, for timing drift by a MAC layer packet timing information compensator 155, as well as for manufacturing offset, by a compensation circuit 152 that adds occasional ticks. This drives a hardware counter 154 that counts ticks directly, optionally augmented by a software counter 156 (e.g., via interrupts generated when the hardware counter rolls over). This counter setup represents the intelligent node's best guess at how long it has been awake since last reboot. Each intelligent node maintains a 48-bit counter 158 which represents time since its last reboot, or uptime. Uptime is guaranteed monotonic (non-decreasing), and it is used for on-intelligent node timing of events.

In addition to uptime, each intelligent node maintains a local standard time offset 160, which is an estimate of the difference between its internal clock (uptime 158) and a global network standard, herein Dust Standard Time (DST) 162. DST is zero at midnight on Jan. 1, 2003. The DST offset 160 value is subject to modification from a communication information corrector 161 that derives correction information from the MAC layer. The DST offset 160 value is added to uptime value to generate the intelligent node's best guess at the DST 162 value, with correction. The DST value is used to schedule network events, such as communication with other intelligent nodes and for sampling of sensors. If an intelligent node is a part of multiple networks or has multiple parents or gateways, the DST offset for each can be stored separately. Time synchronization across the network is achieved by exchanging timing information in every link.

Groups of crystals manifest a natural distribution above and below their rated frequency, and only those which are slow can be sped up to the nominal frequency, leaving the other crystals to run fast. One solution to this problem is to speed all crystals up to a speed that is faster than the nominal crystal frequency.

For a given digraph, or communication flow, there are many different superframe implementations. FIG. 9A represents a simple star-connected network in which three intelligent nodes communicate directly with a fourth gateway intelligent node. The digraph in FIG. 9A shows that there should be two "inward" links from each intelligent node to the gateway, and one "outward" link from the gateway to each mote, giving 9 links total. These nine links must be assigned to cells in a superframe. By picking a superframe with 9 time slots and a single channel offset, each of these links can be assigned to a separate cell in the superframe. This assignment is not unique, but an example assignment is shown in FIG. 9B. In the link assignment illustrated in 9B, intelligent node A has two opportunities to send a packet to intelligent node G at the beginning of each cycle, and then no more opportunities to send a packet for the rest of the cycle. By picking a superframe with 12 time slots and 3 channel offsets there are many more options for assigning the nine links to 36 cells. One such assignment is shown in FIG. 9C. These diagrams thus illustrate the efficiency of spectrum and time usage and suggest how links can be ordered in order to be optimized.

FIG. 10A and FIG. 10B are together an example of a digraph associated with a linear network and an example implementation of that digraph in a superframe with 12 slots. The similarities and differences with the example of FIGS. 9A-C will be evident.

Figure 11:
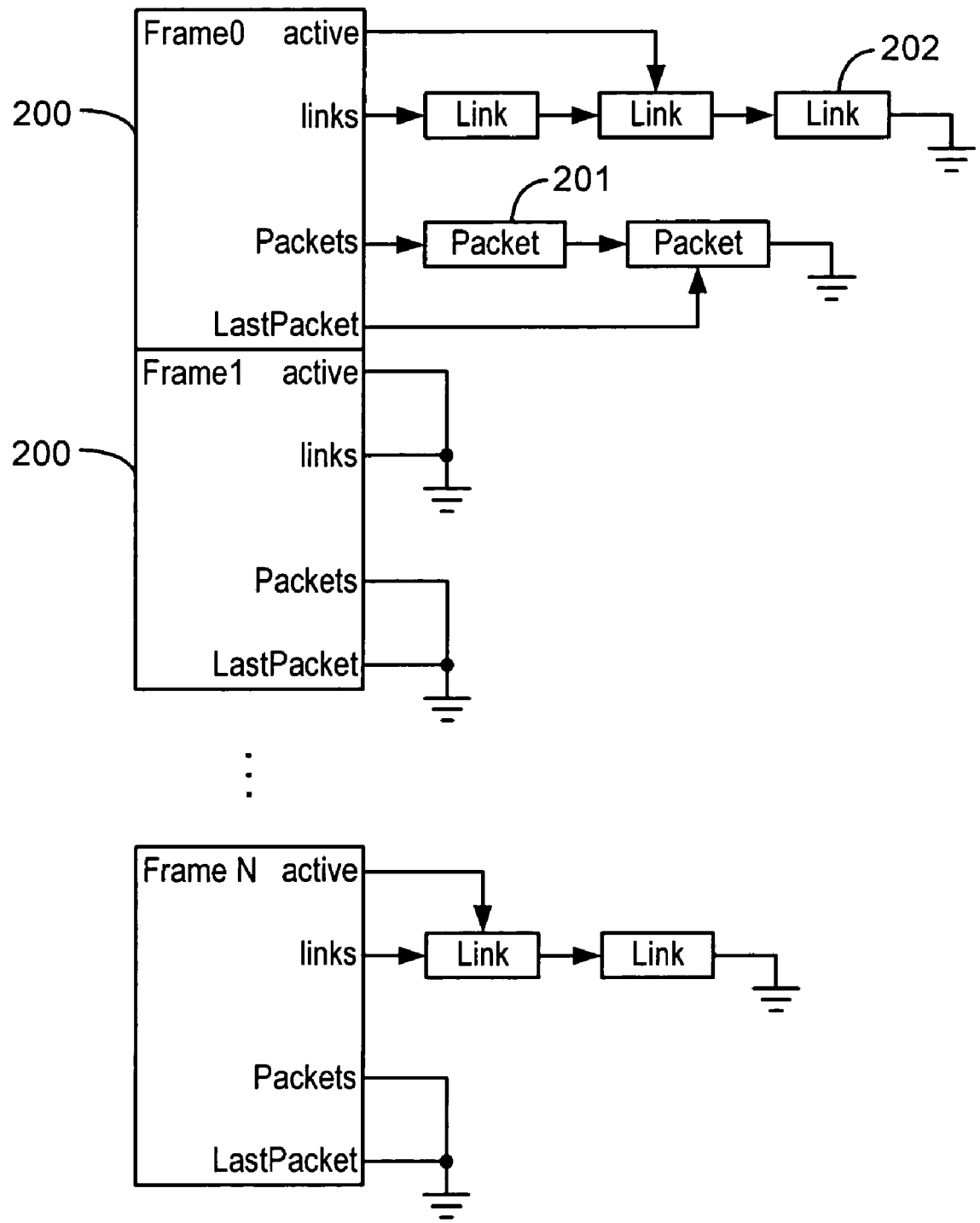
FIG. 11 is a diagram that shows how data storage is organized on the intelligent node, with links and packets associated with superframes.

FIG. 11 shows an example of how data storage is organized on the intelligent node, with links and packets associated with superframes. These also teach the invention with an illustration of the efficiency of spectrum and time usage, suggesting how links can be ordered so that they can be optimized.

Figure 12:
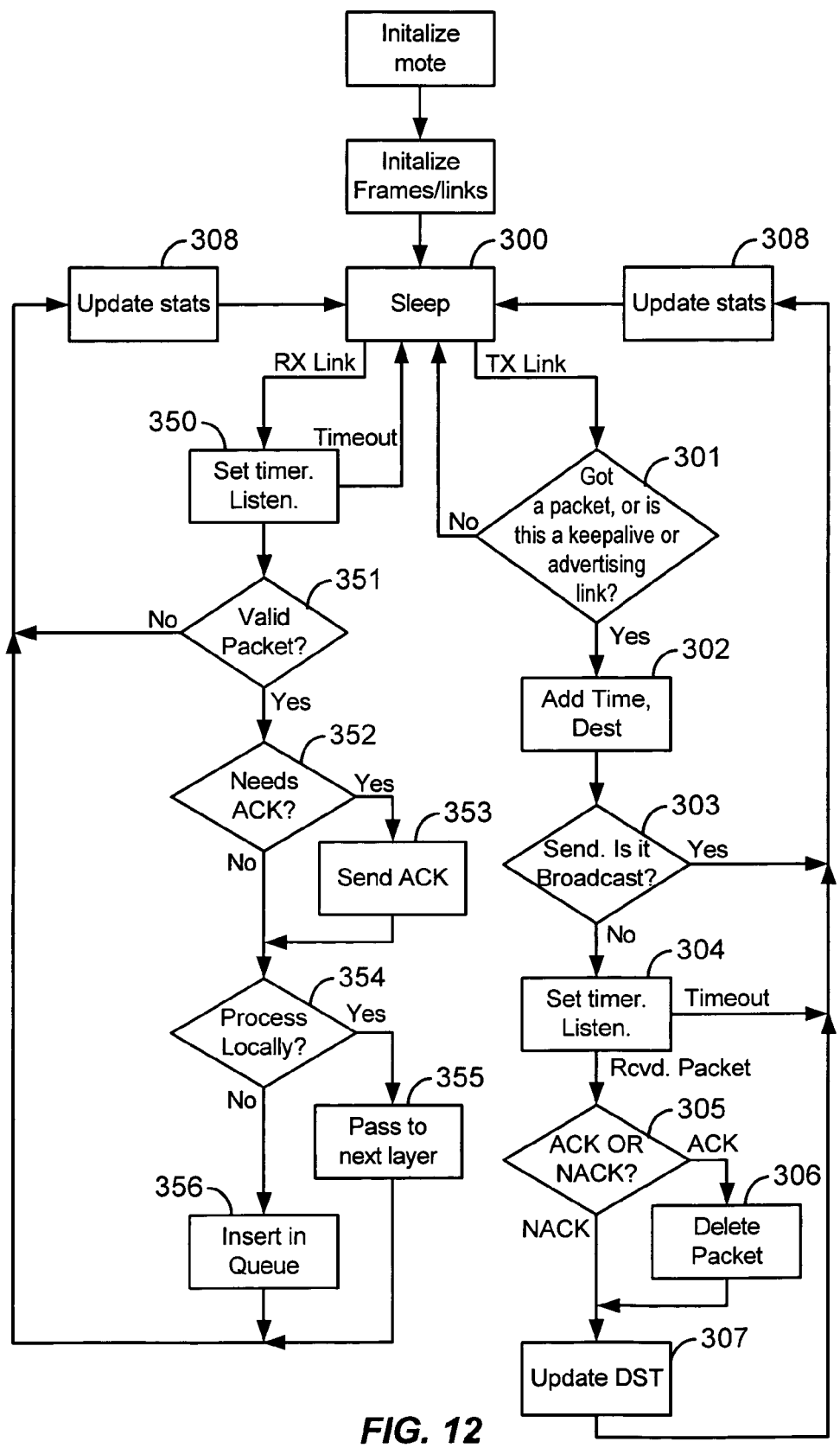
FIG. 12 is a diagram that shows the portion of an intelligent node state machine associated with communication.

FIG. 12 shows that part of an intelligent node state machine that is associated with communication. Once a mote is initialized, it invokes an idle or sleep state 300 during which it listens 350 until timeout or until it receives a valid packet 351, acknowledges 353. It determines whether to process the packet locally 354, whereupon the packet is passed to the next layer 355 or is inserted in a queue 356, and then status is updated.

On a transmit link, it decides if it has a packet to send (or a beacon signal) 301 and adds destination and time of transmission stamps 302 to send, either direct or via broadcast 303. If direct it sets a timeout and listens for acknowledgment 304, identifies positive or negative acknowledgments 305 and either deletes the packet 306 and/or updates the standard internal time 307.

Figure 13:
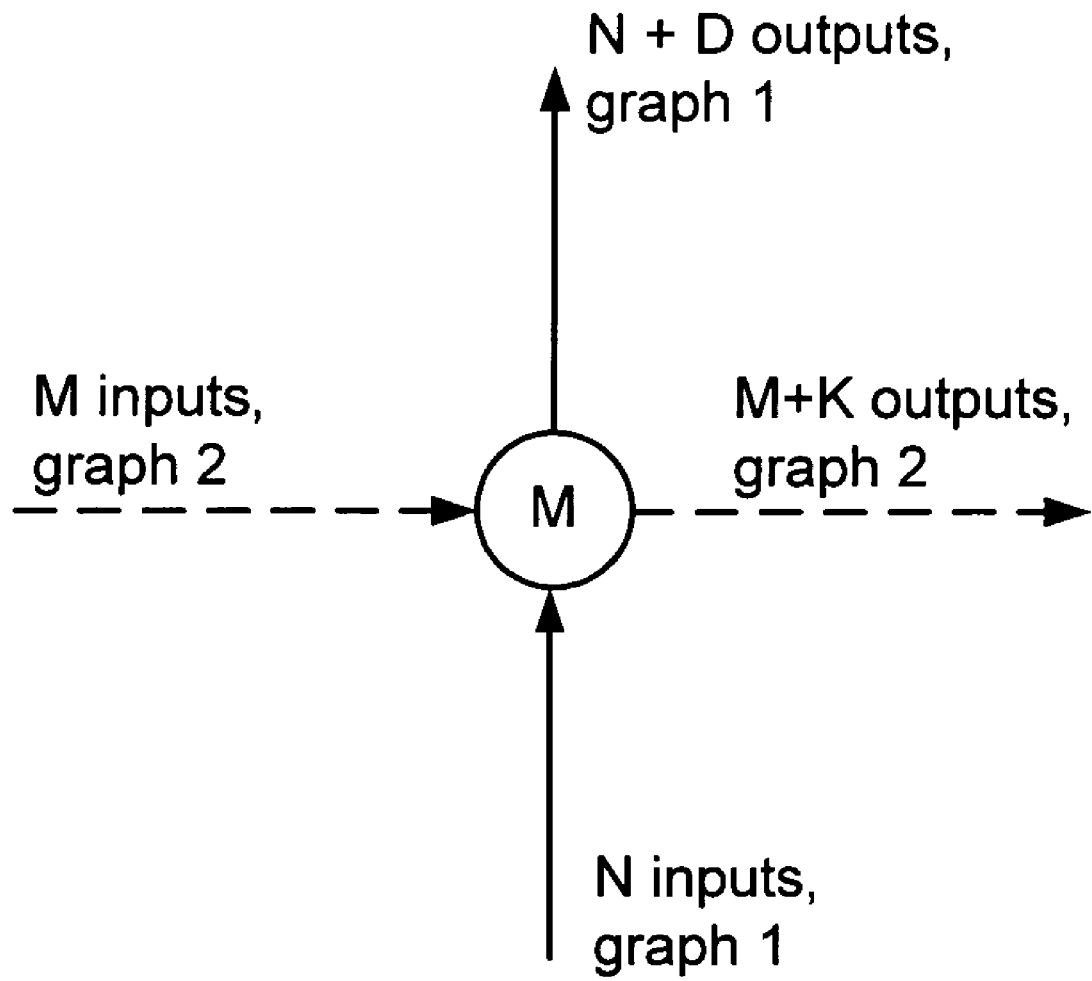
FIG. 13 is a diagram illustrating signal types into and out of an intelligent node.

FIG. 13 is a diagram that illustrates signal types on directed links into and out of an intelligent node. It is understood that there are at least three nodes in the digraph. There is are N inputs from a first graph to an intelligent node N and M inputs from graph 2 to intelligent node M, which will respectively result in N plus D outputs on graph 1 and M plus K outputs on graph 2, indicative of a potential for increase and even crossover of graphs in a superframe. Significantly, the power consumed at intelligent node M is minimized for transmission and receipt by providing for a minimal power idle state when the node is not actively receiving or transmitting in accordance with the synchronization of timing among nodes in the digraph.

The invention has been explained with reference to specific embodiments. Other embodiments will be evident to those of ordinary skill in the art. It is therefore not intended that the invention be limited, except as indicated by the appended claims.

What is claimed is:

1. A node in a wireless mesh data network, comprising:
   an internal time reference, wherein the internal time reference is used for determining a time for receiving at the node or transmitting from the node;
   a radio receiver, wherein the radio receiver receives a packet on one of a plurality of channels, and wherein the packet is received on a channel that is selected according to a sequence of channels and at the determined receive time that is selected according to a sequence of times;
   a radio transmitter, wherein the radio transmitter transmits a packet on one of a plurality of channels, and wherein the packet is transmitted on a channel that is selected according to a sequence of channels and at the determined transmit time that is selected according to a sequence of times;
   a temperature sensor for stabilizing the internal time reference against drifting with respect to an internal time reference of another node in the wireless mesh data network, wherein the wireless mesh data network comprises a matrix of peer communication nodes; and
   a microprocessor for managing the reception and transmission of information, wherein the microprocessor further synchronizes the internal time reference to the internal time reference of another node using information received by the radio receiver and information from the temperature sensor.

2. The node as recited in claim 1, wherein the internal time reference is a crystal oscillator.

3. The node as recited in claim 1, wherein the internal time reference is a 32,768 Hz crystal.

4. The node as recited in claim 1, wherein the radio receiver receives in an ISM radio band.

5. The node as recited in claim 1, wherein the radio receiver receives in the 900 MHz ISM radio band.

6. The node as recited in claim 1, wherein the radio receiver receives in the 2.4 GHz ISM radio band.

7. The node as recited in claim 1, wherein the radio receiver receives in the 5.8 GHz ISM radio band.

8. The node as recited in claim 1, wherein the radio transmitter transmits in an ISM radio band.

9. The node as recited in claim 1, wherein the radio transmitter transmits in the 900 MHz ISM radio band.

10. The node as recited in claim 1, wherein the radio transmitter transmits in the 2.4 GHz ISM radio band.

11. The node as recited in claim 1, wherein the radio transmitter transmits in the 5.8 GHz ISM radio band.

12. The node as recited in claim 1, wherein transmitted information or received information includes information that can be used to derive synchronization of the internal time reference to the internal time reference of another node.

13. The node as recited in claim 1, wherein the microprocessor further manages power utilization such that power utilization is reduced in order to increase the usefulness of power limited nodes.

14. The node as recited in claim 1, wherein the microprocessor management of the reception and transmission of information is according to a superframe schedule.

15. The node as recited in claim 1, further including a battery.

16. The node as recited in claim 1, further including a digital counter, wherein the internal time reference is stabilized by adjusting the digital counter.

17. The node as recited in claim 16, wherein the digital counter is adjusted by adding additional ticks to the digital counter at a frequency dependent on the temperature sensor.

18. The node as recited in claim 1, further including a crystal oscillator, wherein the internal time reference is stabilized by adjusting the frequency of the crystal oscillator.

19. The node as recited in claim 1, further including a memory for storing a calibration data.

20. The node as recited in claim 19, wherein the calibration data comprises a table that stores tick delay data for one or more temperatures.

21. The node as recited in claim 1, wherein the sequence of channels comprises a pseudorandom sequence.

22. The node as recited in claim 21, wherein the pseudorandom sequence is a function of a time slot for communication.

23. The node as recited in claim 1, wherein the sequence of channels comprises a sequence in which a channel is incremented by one modulo a total number of channels.

24. The node as recited in claim 1, wherein a transmit time or a receive time that is selected according to a sequence of times is determined based at least in part on a time slot in a superframe.

* * * * *